US012787727B2

(12) United States Patent
Hu et al.

(10) Patent No.: US 12,787,727 B2
(45) Date of Patent: Nov. 3, 2026

(54) ISOLATION STRUCTURE FOR eDRAM AND METHOD FOR MAKING SAME

(71) Applicant: Hangzhou HFC Semiconductor Co., Hangzhou (CN)

(72) Inventors: Mingyu Hu, Dalian (CN); Liang Li, Singapore (SG)

(73) Assignee: Hangzhou HFC Semiconductor Co., Hangzhou (CN)

( * ) Notice: Subject to any disclaimer, the term of this patent is extended or adjusted under 35 U.S.C. 154(b) by 338 days.

(21) Appl. No.: 18/514,907

(22) Filed: Nov. 20, 2023

(65) Prior Publication Data

US 2025/0120067 A1 Apr. 10, 2025

(30) Foreign Application Priority Data

Oct. 10, 2023 (CN) ........................ 202311309094.6

(51) Int. Cl.

*H10W 10/00* (2026.01)
*H10B 12/00* (2023.01)
*H10W 10/17* (2026.01)

(52) U.S. Cl.

CPC ........ *H10W 10/014* (2026.01); *H10B 12/038* (2023.02); *H10B 12/37* (2023.02); *H10W 10/17* (2026.01)

(58) Field of Classification Search

CPC ............ H10W 10/014; H10W 10/0145; H10B 12/038–0387

See application file for complete search history.

(56) References Cited

U.S. PATENT DOCUMENTS

| | | | | |
|---|---|---|---|---|
| 5,940,717 A * | 8/1999 | Rengarajan .......... | H10B 12/038 257/E21.651 |
| 6,815,307 B1 * | 11/2004 | Hsu ........................ | H10D 1/047 438/389 |
| 7,705,386 B2 * | 4/2010 | Cheng ................ | H10B 12/0387 257/305 |
| 8,673,729 B1 | 3/2014 | Basker et al. | |
| 8,946,802 B2 | 2/2015 | Basker et al. | |
| 2005/0151182 A1 * | 7/2005 | Chen ................ | H10W 10/0145 257/E21.549 |

* cited by examiner

*Primary Examiner* — Daniel Luke

(74) *Attorney, Agent, or Firm* — MUNCY, GEISSLER, OLDS & LOWE, P.C.

(57) ABSTRACT

An eDRAM and a method for making it are disclosed. In the method, a pad oxide layer and a pad nitride layer are removed after an active area and a deep trench filled with polysilicon are formed, followed by the formation of a re-deposited oxide layer and a re-deposited nitride layer. The re-deposited nitride layer has greater uniformity than the pad nitride layer that has undergone the formation of the deep trench. An isolation recess is then formed at one side of the deep trench and then filled with a first isolation dielectric. In this process, the re-deposited nitride layer can be utilized to control the height and flatness of a top surface of the isolation dielectric. After that, an upper polysilicon recess between a first active sub-region and the first isolation dielectric is filled with a second isolation dielectric.

12 Claims, 9 Drawing Sheets

ISOLATION STRUCTURE FOR eDRAM AND METHOD FOR MAKING SAME

CROSS-REFERENCE TO RELATED APPLICATION

This application claims the priority of Chinese patent application number 202311309094.6, filed on Oct. 10, 2023, and entitled "EDRAM AND METHOD FOR MAKING SAME", the entire contents of which are incorporated herein by reference.

TECHNICAL FIELD

The present invention relates to the field of semiconductor technology and, in particular, to an embedded dynamic random-access memory (eDRAM) and a method for making the eDRAM.

BACKGROUND

Deep trench capacitors (DTCs) may be formed before MOSFETs, without affecting the MOSFETs' properties. Therefore, dynamic random-access memory (DRAM) employing DTCs may be integrated on the same wafer as logic circuit. Such DRAM is known as embedded DRAM (eDRAM). An eDRAM cell generally includes one or more DTCs and one or more two-dimensional (2D) MOSFETs or FinFETs coupled thereto.

FIG. 1 is a cross-sectional view of a structure resulting from filling deep trenches DT in a substrate 100 with polysilicon PS using a conventional technique. Referring to FIG. 1, in the conventional technique, before the deep trenches DT are formed in the substrate 100, a pad oxide layer 101 and a pad nitride layer 102 are usually stacked over the surface of the substrate 100. After active areas 110 and the deep trenches DT are formed in the substrate 100, the deep trenches DT are lined with a dielectric layer 103, and the polysilicon PS is filled therein, optionally with a barrier layer 103*a* (e.g., titanium nitride (TiN)) being sandwiched between the dielectric layer 103 and the polysilicon layer PS. An etching process follows to partially remove the polysilicon PS so that its top surface is lower than a top surface of the active areas 110 on both sides thereof. After that, with photoresist PR serving as a mask, another etching process is performed on the active areas 110 and the polysilicon PS between adjacent deep trenches DT. FIG. 2 is a cross-sectional view of a structure resulting from forming isolation recesses 10 between adjacent deep trenches DT and depositing an isolation dielectric 120 into the isolation recesses 10 and on the top surface of the polysilicon PS. Referring to FIG. 2, as a result of the etching process, the isolation recesses 10 are formed between adjacent deep trenches DT, and the isolation dielectric 120 is deposited into the isolation recesses 10 and on the top surface of the polysilicon PS, followed by planarization using a chemical mechanical polishing (CMP). The polishing process stops at the pad nitride layer 102, and the pad nitride layer 102 is then stripped away.

FIGS. 3A and 3B are cross-sectional view of a structure resulting from forming word lines (WLs) above the substrate 100 in the conventional technique. Referring to FIGS. 3A and 3B, a plurality of word lines are formed above the substrate 100 to provide gates of transistors in the active areas 110. The word lines may be passing word line (PWLs) formed on the isolation dielectric 120. However, due to poor uniformity of, and possible presence of local voids in the pad nitride layer 102 during the formation of the isolation dielectric 120, after the CMP process, the isolation dielectric 120 may have a varying height across the substrate 100, as shown in FIGS. 3A and 3B. Consequently, apart from possible inconsistent and instable performance of the resulting memory cells, and serious parasitic capacitance, or even a short-circuit problem, which is detrimental to over eDRAM performance and yield, may occur, due to extreme thinness of the isolation dielectric 120 and hence extreme proximity between the polysilicon PS and some passing word lines (PWLs) formed on the isolation dielectric 120.

SUMMARY OF THE INVENTION

The present invention seeks to provide an eDRAM with a more uniformly filled isolation dielectric in isolation recesses formed at side walls of deep trenches and with assured effective isolation between polysilicon in the deep trenches and word lines formed over the isolation dielectric, as well as a method for making such an eDRAM.

In one aspect of the present invention, a method for making an eDRAM is provided, wherein the method comprises:

- forming a stack of a pad oxide layer and a pad nitride layer above a surface of a substrate;
- forming, in the substrate, at least one active area and at least one deep trench filled with polysilicon, the deep trench partitioning the active area into a first active sub-region and a second active sub-region at opposite sides of the deep trench, the polysilicon in an upper portion of the deep trench joined to the first active sub-region and the second active sub-region, the polysilicon having a top surface lower than a top surface of the active area;
- removing the pad nitride layer and the pad oxide layer;
- forming a stack of a re-deposited oxide layer and a re-deposited nitride layer above the substrate;
- etching the second active sub-region and the polysilicon joined to the second active sub-region, thereby forming an isolation recess at the side of the deep trench opposite to the first active sub-region;
- filling the isolation recess with a first isolation dielectric, wherein a remaining portion of the polysilicon in the upper portion of the deep trench is situated between the first active sub-region and the first isolation dielectric, and wherein the first active sub-region, the polysilicon and the first isolation dielectric delimit an upper polysilicon recess;
- at least removing a portion of the re-deposited nitride layer above a top surface of the first active sub-region and forming a second isolation dielectric in the upper polysilicon recess, the second isolation dielectric having a top surface higher than the top surface of the first active sub-region; and
- forming at least one word line over the substrate, wherein the word line crosses over the first isolation dielectric and/or the second isolation dielectric.

In another aspect of the present invention, an eDRAM fabricated according to the method as defined above is provided. The eDRAM comprises:

- a substrate, in which at least one first active sub-region is formed;
- at least one deep trench formed in the substrate, wherein the deep trench is filled with polysilicon, wherein the polysilicon in an upper portion of the deep trench is joined to the first active sub-region and has a top surface lower than a top surface of the first active sub-region;

a first isolation dielectric formed in an isolation recess, wherein the isolation recess is located at one side of the deep trench and is opposite to the first active sub-region, wherein the top surface of the polysilicon in the upper portion of the deep trench is lower than a top surface of the first isolation dielectric;

a second isolation dielectric formed in an upper polysilicon recess, wherein the upper polysilicon recess is delimited by the polysilicon, and the first active sub-region and the first isolation dielectric that are located at the opposite sides of the polysilicon; and at least one word line formed above the substrate, wherein the word line crosses over the first isolation dielectric and/or the second isolation dielectric.

In the method provided in the present invention, the pad oxide layer and the pad nitride layer are removed from the surface of the substrate after the active area and the deep trench filled with the polysilicon are formed, followed by the formation of the re-deposited oxide layer and the re-deposited nitride layer. The re-deposited nitride layer has greater uniformity than the pad nitride layer that has undergone the formation of the deep trench. The isolation recess is then formed at one side of the deep trench and then filled with the first isolation dielectric. In this process, the re-deposited nitride layer can be utilized to control top surface height and flatness of the first isolation dielectric. After that, the upper polysilicon recess between the first active sub-region and the first isolation dielectric is filled with the second isolation dielectric. With the first isolation dielectric and the second isolation dielectric isolating the polysilicon in the deep trench from the word line, effective isolation between the polysilicon and the word line that crosses over the first isolation dielectric and/or the second isolation dielectric can be ensured, which allows the resulting eDRAM to have improved performance and yield. In the eDRAM sought to be protected hereby, which is fabricated according to the method provided herein, the polysilicon in the deep trench is effectively isolated from the word line crossing over the first isolation dielectric and/or the second isolation dielectric. Therefore, it has improved performance and yield.

DETAILED DESCRIPTION

EDRAMs and methods according to specific embodiments of the present invention will be described in greater detail below with reference to the accompanying drawings. It is understood that the figures are provided in a very simplified form not necessarily drawn to exact scale and only for the sake of easier and clearer description of the embodiments. Additionally, as used herein, spatially relative terms are intended to encompass different orientations of the device in use or operation in addition to the orientation depicted in the figures. For example, if the device in the figures is inverted or otherwise oriented (e.g., rotated), the exemplary term “over” can encompass an orientation of “under” and other orientations.

Embodiments of the present invention are directed to a method of forming an eDRAM and an eDRAM fabricated according to the method. The eDRAM includes deep trench capacitors (DTCs), which can provide relatively large capacitance. More specifically, the eDRAM may include two-dimensional (2D) MOSFETs coupled to the DTCs. With this method, various problems arising from poor uniformity of, and possible presence of local voids in a pad nitride layer, as is conventional, can be mitigated. The method will be illustrated and described below with reference to FIGS. 4 to 20.

Embodiment 1

Figure 1:
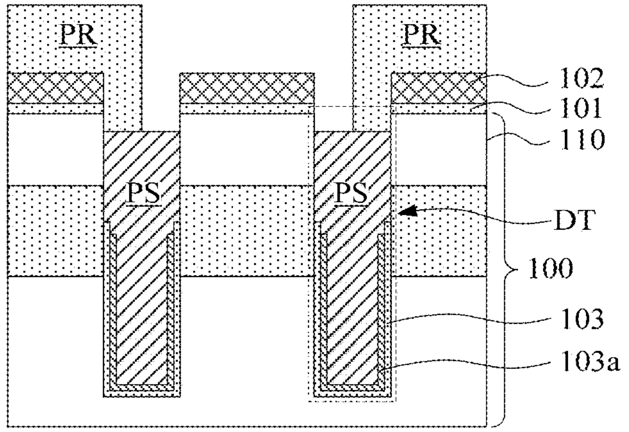
Fig. 1 (Prior Art)
FIG. 1 is a schematic cross-sectional view of polysilicon-filled deep trenches formed in a substrate using a conventional technique.
Figure 2:
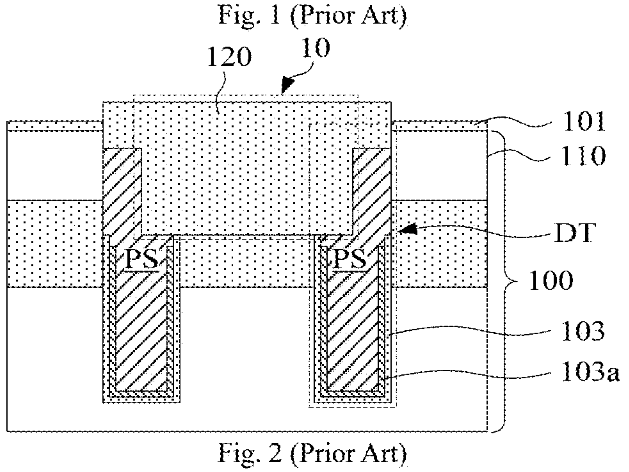
Fig. 2 (Prior Art)
FIG. 2 is a schematic cross-sectional view of a structure resulting from forming isolation recesses between adjacent deep trenches and filling them with an isolation dielectric in the conventional technique.
Figure 3A:
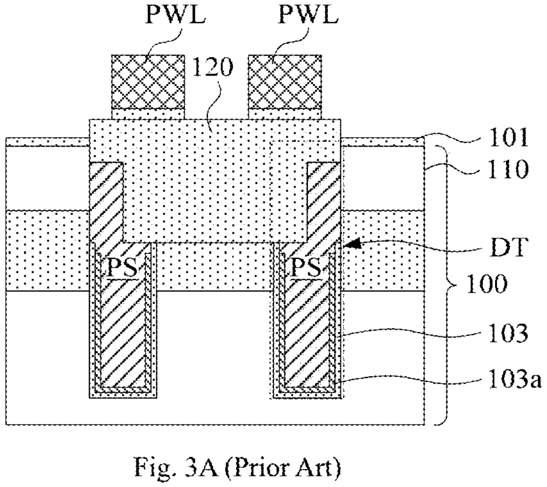
Fig. 3A (Prior Art)
FIGS. 3A and 3B are schematic cross-sectional views of different areas of a structure resulting from forming word lines above the substrate in the conventional technique.
Figure 3B:
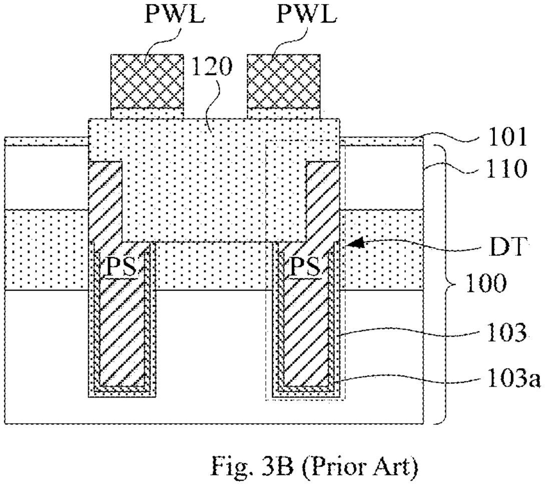
Fig. 3B (Prior Art)
Figure 4:
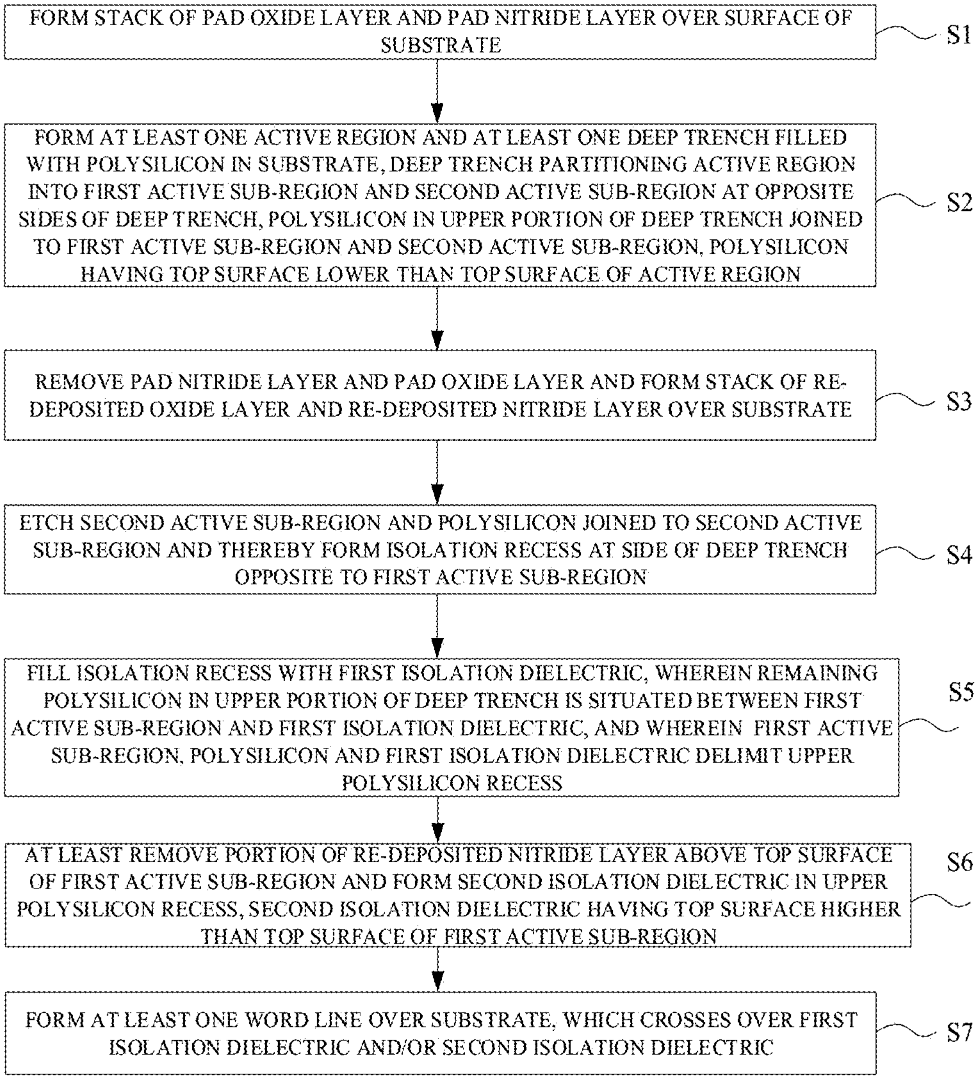
FIG. 4 is a schematic flow diagram of a method for making an eDRAM according to an embodiment of the present invention.
Figure 5A:
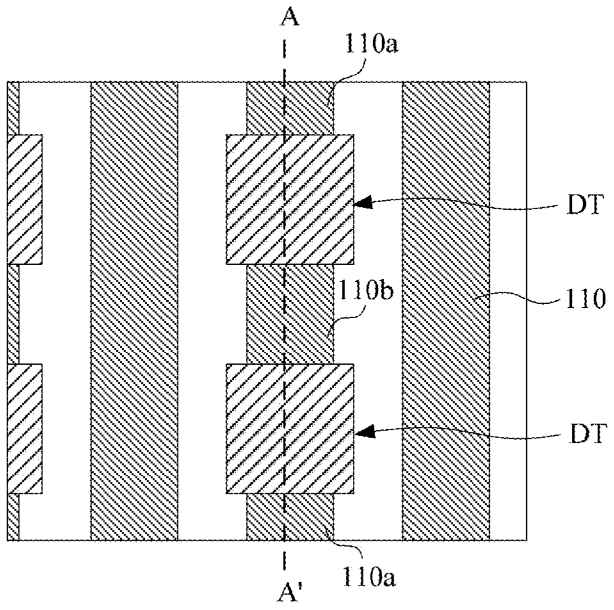
FIG. 5A is a schematic plan view of active areas and polysilicon-filled deep trenches formed in a method for making an eDRAM according to an embodiment of the present invention.
Figure 5B:
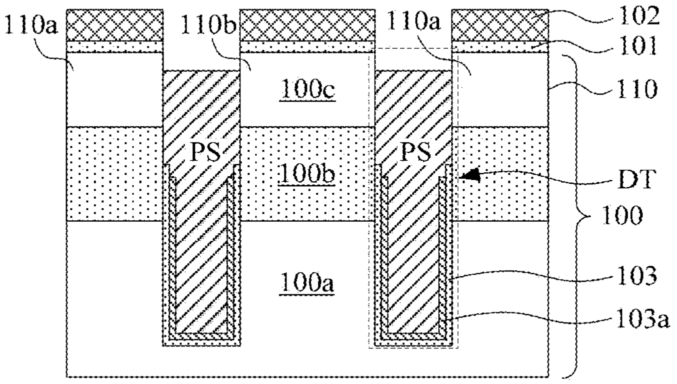
FIG. 5B is a schematic cross-sectional view taken along line AA' in FIG. 5A.

FIGS. 5A and 5B are plan and cross-sectional views, respectively, of active areas 110 and deep trenches DT filled with polysilicon PS, which are formed in a substrate 100. Referring to FIGS. 4, 5A and 5B, according to an embodiment of the present invention, in step S1, a stack of a pad oxide layer 101 and a pad nitride layer 102 is formed above a surface of a substrate 100. In step S2, at least one active area 110 and at least one deep trench DT filled with polysilicon PS are formed in the substrate.

For example, the substrate 100 may be a silicon-on-insulator (SOI) substrate including a doped substrate layer 100*a*, a buried oxide layer 100*b* overlying the doped substrate layer 100*a* and a device layer 100*c* located on the buried oxide layer 100*b*. For example, the doped substrate layer 100*a* may be a heavily-doped P-type silicon substrate.

For example, the buried oxide layer 100*b* may be a silicon oxide layer. For example, the device layer 100*c* may be a P-type doped silicon layer.

The active area 110 may be defined by an isolation (e.g., shallow trench isolation (STI)) structure formed in the substrate 100. The isolation structure may be formed according to any suitable disclosed method, and the formation may involve an etching process, in which the pad oxide layer 101 and the pad nitride layer 102 may serve as a hard mask. In embodiments where the device layer 100*c* is silicon, the pad oxide layer 101 may be, for example, a silicon oxide layer, and the pad nitride layer 102 may be, for example, a silicon nitride layer.

FIG. 5B is a schematic cross-sectional view taken along line AA' in FIG. 5A. Referring to FIGS. 5A and 5B, the deep trench DT may be, for example, formed after the active area 110 has been formed. The deep trench DT may extend through the device layer 100*c* and the buried oxide layer 100*b* into the doped substrate layer 100*a*. The deep trench DT may be formed according to any suitable disclosed method, and the formation may involve an etching process, in which the pad oxide layer 101 and the pad nitride layer 102 may serve as a hard mask. As shown in FIGS. 5A and 5B, for example, each deep trench DT may traverse one active area 110. As an example, each active area 110 may be partitioned by multiple deep trenches DT. Each deep trench DT may partition one active area 110 into a first active sub-region 110*a* and a second active sub-region 110*b* at opposite sides of the corresponding deep trench DT. As shown in FIG. 5A, as an example, a plurality of deep trenches DT may be formed in the substrate 100, and adjacent deep trenches DT may partition a single active area 110 and share a second active sub-region 110*b*.

The formation of the deep trench DT is part of the formation of a DTC. In the first active sub-region 110*a*, a MOSFET is to be formed, which is coupled to the DTC formed at a corresponding deep trench DT. After the formation of the deep trench DT, it may be lined with a dielectric layer 103, and polysilicon PS may be filled therein. The dielectric layer 103 may cover a surface of the doped substrate layer 100*a* exposed in the deep trench DT, as well as a surface of the portion of the buried oxide layer 100*b* also exposed in the deep trench DT. Optionally, prior to the filling of the polysilicon PS, a barrier layer 103*a* (which may include titanium (Ti), titanium nitride (TiN), tantalum nitride (TaN) or the like) may be formed over a surface of the dielectric layer 103. The barrier layer 103*a* may serve to block diffusion of dopant ions from the polysilicon PS into the dielectric layer 103. The filling of the deep trench DT with the polysilicon PS may involve depositing the polysilicon so that it fills up the deep trench DT and covers a surface of the pad nitride layer 102 outside of the deep trench DT and then partially etching away the polysilicon so that the top surface of the polysilicon is lower than a top surface of the active area 110. As shown in FIG. 5B, the polysilicon PS in an upper portion of the deep trench DT is joined to the first active sub-region 110*a* and the second active sub-region 110*b* that are located at opposite sides of the deep trench DT. The polysilicon PS may be electrically doped by in-situ doping or ion implantation.

Figure 6:
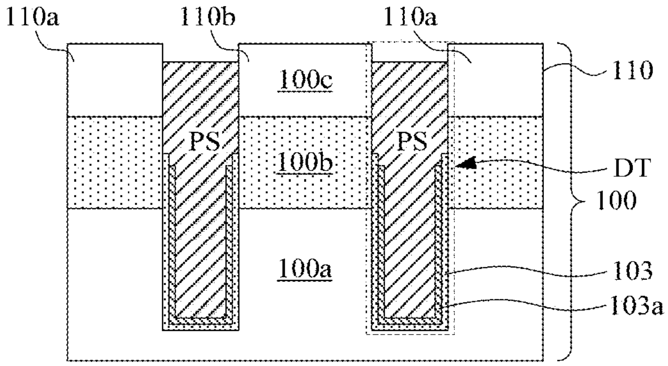
FIGS. 6 to 16 are schematic cross-sectional views of structures resulting from steps in a method for making an eDRAM according to a first embodiment of the present invention.
Figure 7:
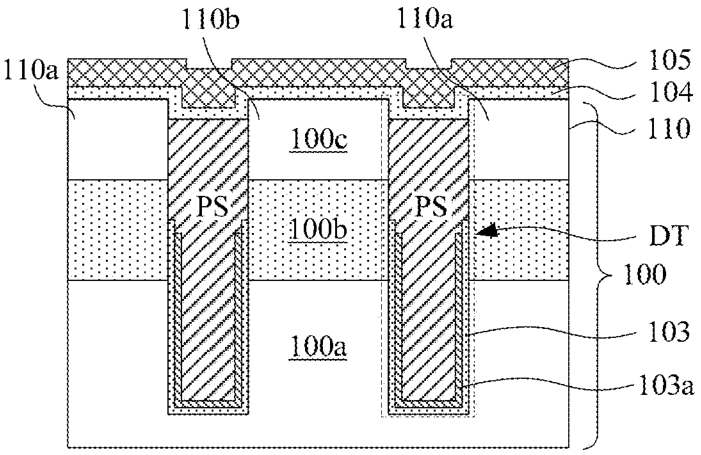

Since the pad nitride layer 102 is formed earlier than the active area 110, the pad nitride layer 102 will show poor thickness uniformity and integrity and is therefore removed after the polysilicon PS is filled in the deep trench DT. FIG. 6 is a cross-sectional view of a structure resulting from removing the pad oxide layer 101 and the pad nitride layer 102. FIG. 7 is a cross-sectional view of a structure resulting from the formation of a re-deposited oxide layer 104 and a re-deposited nitride layer 105. Referring to FIGS. 4, 6 and 7, according to embodiments of the present invention, in step S3, the pad nitride layer 102 and the pad oxide layer 101 are removed, followed by the formation of the stacked re-deposited oxide layer 104 and re-deposited nitride layer 105 over the substrate 100.

For example, the re-deposited oxide layer 104 may be silicon oxide and deposited using an atomic layer deposition (ALD) process. For example, the re-deposited nitride layer 105 may be silicon nitride and formed using a chemical gas deposition (CVD) process. As shown in FIG. 7, for example, the stacked re-deposited oxide layer 104 and re-deposited nitride layer 105 may cover the surface of the substrate 100 with the polysilicon PS having been filled in the deep trench DT.

Figure 8:
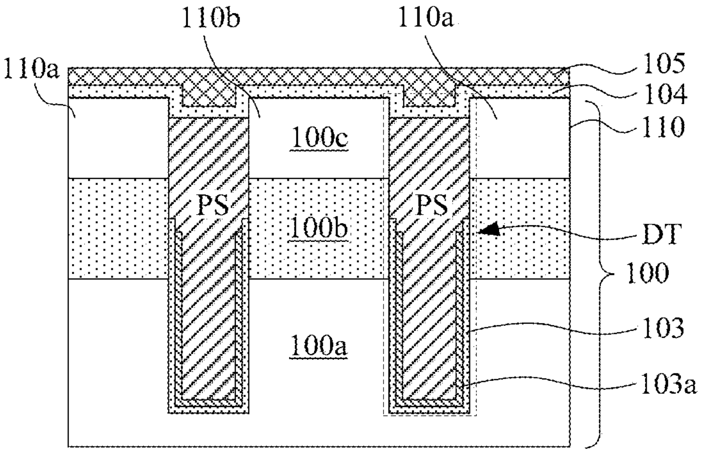

FIG. 8 is a cross-sectional view of a structure resulting from a CMP process performed on the re-deposited nitride layer 105. As shown in FIG. 8, a CMP process may be optionally performed to flatten a top surface of the re-deposited nitride layer 105.

Referring to FIG. 4, in step S4, an etching process is performed on the second active sub-region 110*b* and the polysilicon PS joined to the second active sub-region 110*b* to form an isolation recess at the side of the deep trench DT opposite to the first active sub-region 110*a* (i.e., the resulting isolation recess and the first active sub-region 110*a* are located at opposite sides of the deep trench DT).

Figure 9:
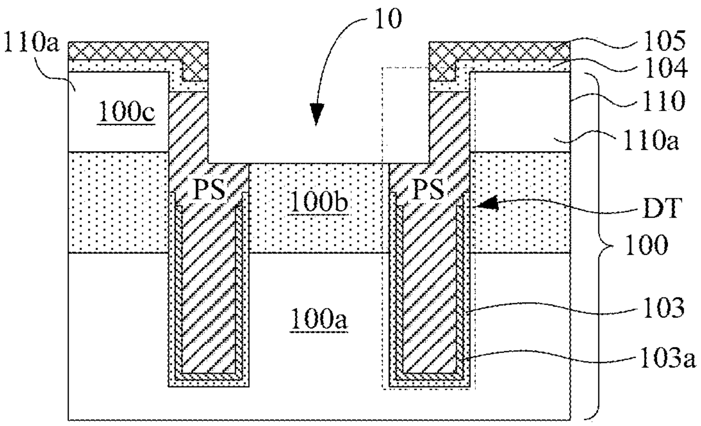

FIG. 9 shows a cross-sectional view of a structure resulting from the formation of the isolation recess 10. Referring to FIG. 9, in step S4, first of all, a first mask layer is formed on the surface of the re-deposited nitride layer 105 and patterned to define the isolation recess. For example, the first mask layer may include an organic planarization layer (OPL) covering the re-deposited nitride layer 105, a bottom anti-reflection coating (BARC) layer covering the OPL layer and a photoresist layer located on the BARC layer. After that, with the first mask layer serving as a mask, an etching (e.g., dry etching) process is performed on the second active sub-region 110*b* beside the deep trench DT and the polysilicon PS in the deep trench DT, which is joined to the second active sub-region 110*b*. In this embodiment, as a result of the etching process, the second active sub-region 110*b* between adjacent deep trenches DT, as well as portions of the polysilicon PS in the deep trenches DT proximal to the second active sub-region 110*b*, is removed, resulting in the isolation recess 10 formed between the two adjacent deep trenches DT. A surface of the polysilicon PS exposed in the isolation recess 10 comprises an L shape. After that, the first mask layer is removed.

The isolation recess 10 is subsequently filled with an isolation dielectric, which isolates the polysilicon PS remaining in the deep trench DT from a word line to be subsequently formed and passes over the deep trench DT (i.e., a passing word line (PWL)). In this embodiment, the isolation recess 10, which is formed by forming the first mask layer on the re-deposited nitride layer 105 and then etching the second active sub-region 110*b* and the polysilicon PS in the deep trench DT, may have any desired depth.

The isolation recess 10 exposes the buried oxide layer 100*b* underlying the second active sub-region 110*b* and a side surface of the polysilicon PS located in an upper portion of the deep trench DT, wherein the polysilicon PS located in an upper portion of the deep trench DT is joined to the first active sub-region 110*a*. The stacked re-deposited oxide layer 104 and re-deposited nitride layer 105 cover a surface of the first active sub-region 110*a* and the top surface of the polysilicon PS in the upper portion of the deep trench DT.

Referring to FIG. 4, in step S5, a first isolation dielectric is filled into the isolation recess 10.

Figure 10:
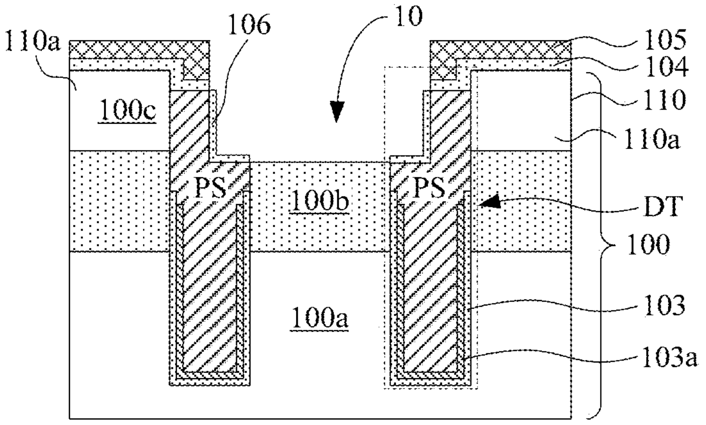

As shown in FIG. 10, a liner oxide layer 106 is formed on the surface of the polysilicon PS exposed in the isolation recess 10.

Figure 11:
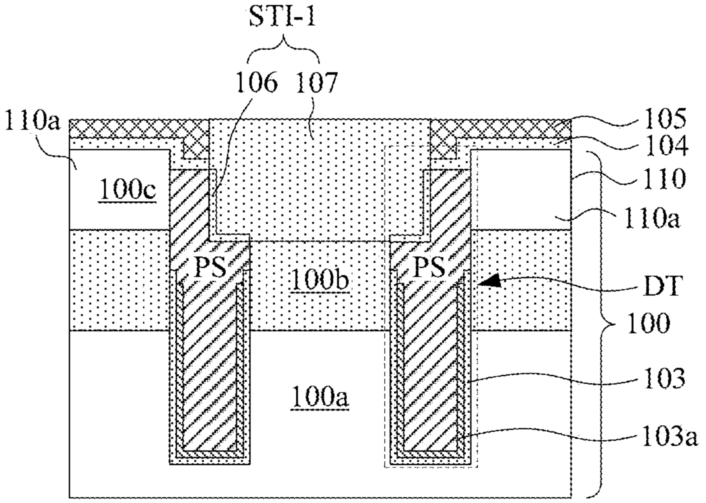

Next, as shown in FIG. 11, a high-density plasma CVD (HDP-CVD) or other suitable process may be employed to deposit a first dielectric material 107 (e.g., silicon oxide) into the isolation recess 10 and onto the re-deposited nitride layer 105, and CMP planarization may follow to remove the first dielectric material 107 above the re-deposited nitride layer 105 so that a top surface of the first dielectric material 107 in the isolation recess 10 is flush with the surface of the re-deposited nitride layer 105. The liner oxide layer 106 and the remaining portion of the first dielectric material 107 form the first isolation dielectric STI-1.

Figure 12:
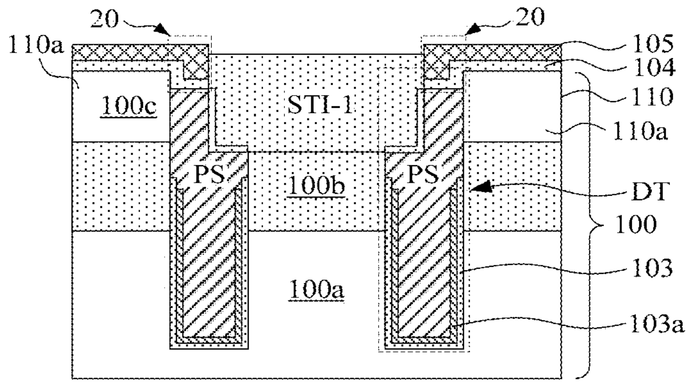

In order to avoid an excessive thickness of the first isolation dielectric STI1, referring to FIG. 12, the first isolation dielectric STI-1 may be optionally etched so that a top surface of the first isolation dielectric STI-1 is lower than the surface of the re-deposited nitride layer 105.

After step S5, the polysilicon PS in the upper portion of the deep trench DT is situated between the first active sub-region 110*a* joined thereto and the first isolation dielectric STI-1, the top surface of the polysilicon PS in the upper portion of the deep trench DT is lower than the top surfaces of the first active sub-region 110*a* and the first isolation dielectric STI-1 that are adjacent to the polysilicon PS. For the sake of easier illustration and description, a space delimited by the polysilicon PS and the first active sub-region 110*a* and the first isolation dielectric STI-1 at its opposite sides is referred to as an upper polysilicon recess 20 hereinafter. The upper polysilicon recess 20 is located between the first active sub-region 110*a* and the first isolation dielectric STI-1.

Referring to FIG. 4, in step S6, at least a portion of the re-deposited nitride layer 105 located above the surface of the first active sub-region 110*a* is removed, and a second isolation dielectric is filled into the upper polysilicon recess 20, and a top surface of the second isolation dielectric is higher than the top surface of the first active sub-region 110*a*.

Figure 13:
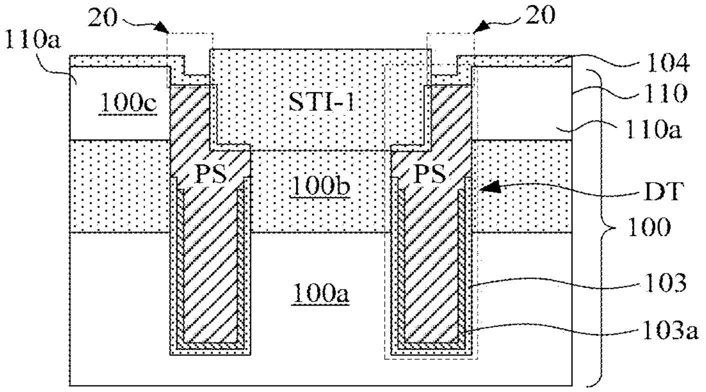
Figure 14:
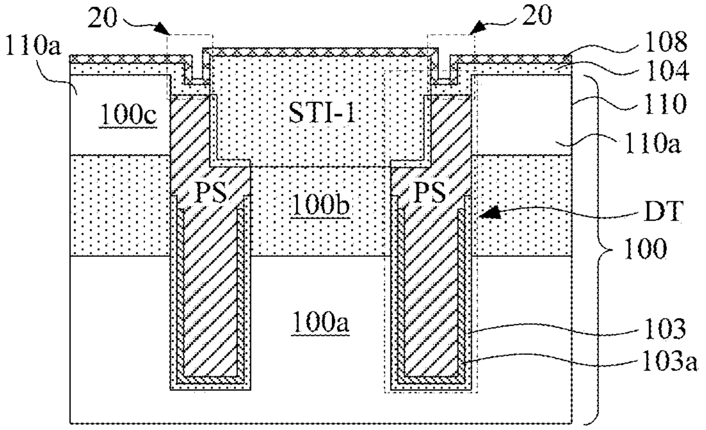
Figure 15:
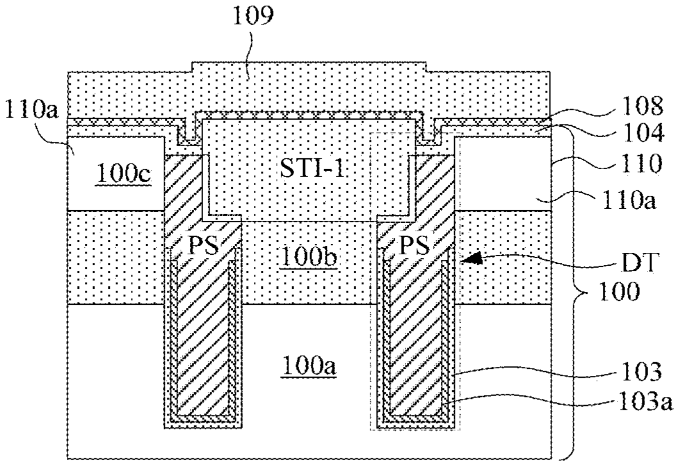
Figure 16:
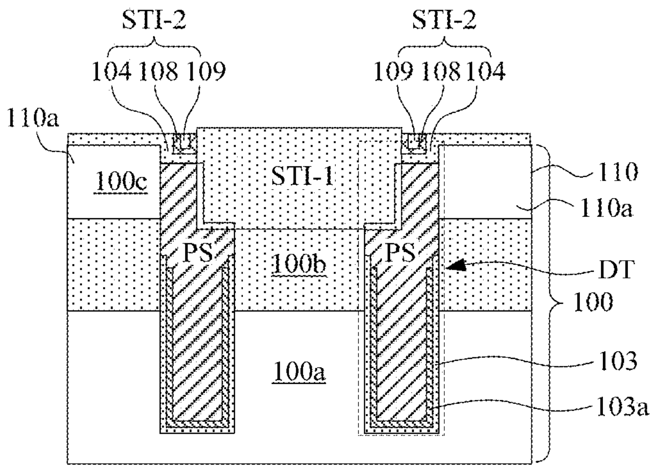

In this embodiment, the filling of the second isolation dielectric into the upper polysilicon recess 20 may include:

- referring to FIG. 13, utilizing etch selectivity of the re-deposited nitride layer 105 over the re-deposited oxide layer 104 and the first isolation dielectric STI-1, removing the re-deposited nitride layer 105 optionally by carrying out a wet or dry etching process thereon, exposing the re-deposited oxide layer 104 that covers the surface of the first active sub-region 110*a* and an inner wall of the upper polysilicon recess 20;
- referring to FIG. 14, then forming a liner nitride layer 108 over the surfaces of the re-deposited oxide layer 104 and the first isolation dielectric STI-1;
- next, referring to FIG. 15, depositing a second dielectric material 109 (e.g., silicon oxide) over the liner nitride layer 108 optionally using a high aspect ratio process CVD (HARP-CVD) or other suitable process;
- planarizing a top surface of the second dielectric material 109 using a CMP process, a portion of the remaining second dielectric material 109 filled in the upper polysilicon recess 20 has a rather large thickness;
- etching away (e.g., using a mask-free etching process) the second dielectric material 109 above a surface of the liner nitride layer 108, and keeping the second dielectric material 109 located in the upper polysilicon recess 20; and
- subsequently, removing the liner nitride layer 108 outside of the upper polysilicon recess 20 (e.g., using a wet etching process), and the re-deposited oxide layer 104, the remaining portion of the liner nitride layer 108 and the second dielectric material 109 in the upper polysilicon recess 20 form the second isolation dielectric STI-2, as shown in FIG. 16.

Optionally, after the second isolation dielectric STI-2 is formed, a CMP process may be performed to reduce a height difference between the top surfaces of the first isolation dielectric STI-1 and the second isolation dielectric STI-2.

Figure 17A:
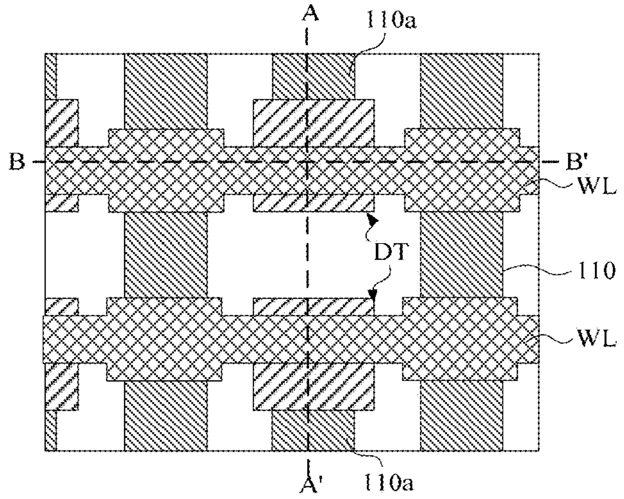
FIG. 17A is a schematic plan view of a structure resulting from the formation of word lines above a substrate in the method according to the first embodiment of the present invention.
Figure 17B:
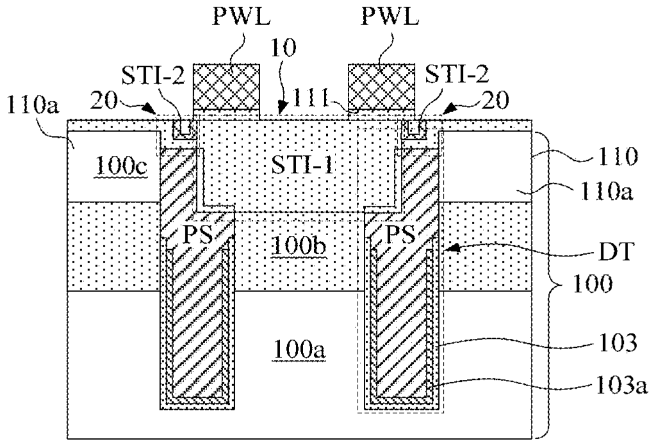
FIG. 17B is a schematic cross-sectional view taken along line AA' in FIG. 17A.

FIGS. 17A and 17B show are plan and cross-sectional views, respectively, of a structure resulting from the formation of word lines WL above the substrate 100. Referring to FIGS. 4, 17A and 17B, in step S7, at least one word line WL is formed above the substrate 100. The word line WL crosses over the first isolation dielectric STI-1 and/or second isolation dielectric STI-2 in a direction defined by BB' line in FIG. 17A.

The word line WL serves to provide a gate of a transistor in the eDRAM to be formed in the first active sub-region 110*a*. The word line WL may be a passing word line (PWL) crossing over first isolation dielectric STI-1 and/or the second isolation dielectric STI-2. The word line WL may include at least one of conductive materials including metals, polysilicon, metal silicides and metal nitrides. A gate dielectric layer 111 may be provided between the word line WL and the substrate 100. The gate dielectric layer 111 may include at least one of silicon oxide, silicon oxynitride and a high-k material. Additionally, a work function metal layer may be formed between the gate dielectric layer 109 and the word line WL. Further, an interlayer dielectric layer may be subsequently formed to cover the word line WL and other structures above the substrate 100.

Embodiment 2

A second embodiment relates to a method for making an eDRAM, which is similar to the method of the first embodiment as shown in FIG. 4, except for a different implementation of step S6. Steps S1 to S5 in the method according to embodiment 2 are not further described below, as they are the same as those of the first embodiment, and reference can be made to the above description in connection with the first embodiment and FIGS. 4 to 12 for details thereof.

Figure 18A:
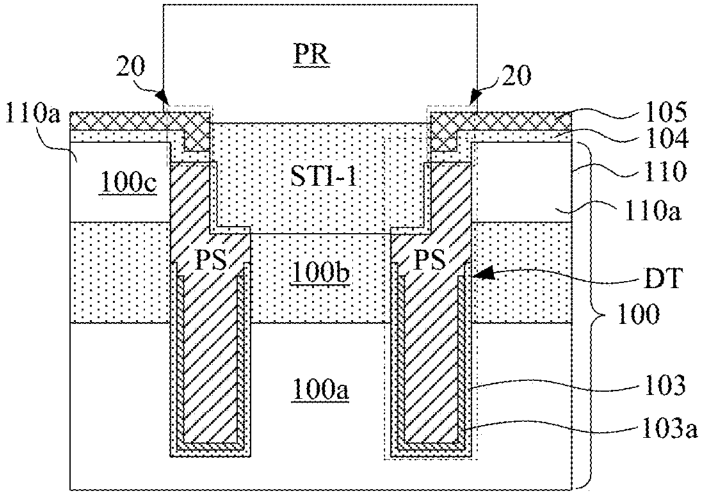
FIG. 18A is a schematic cross-sectional view of a structure resulting from the formation of a second mask layer in a method for making an eDRAM according to a second embodiment of the present invention.
Figure 18B:
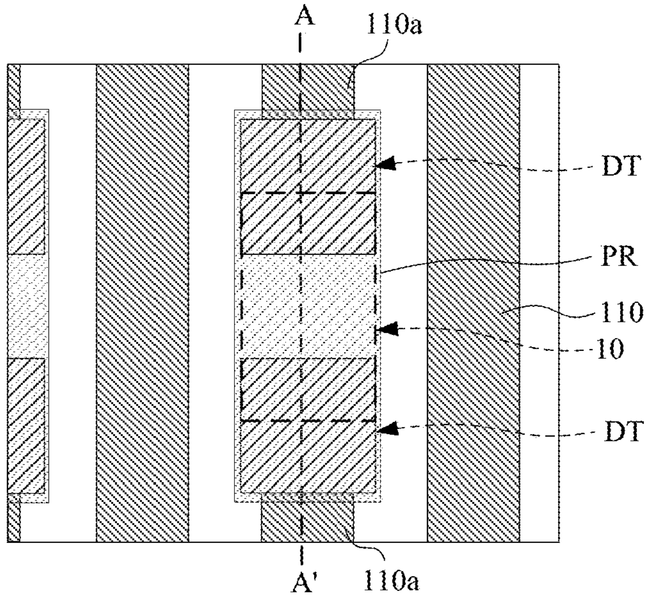
FIG. 18B is a schematic plan view of the second mask layer formed in the method according to the second embodiment of the present invention.
Figure 19:
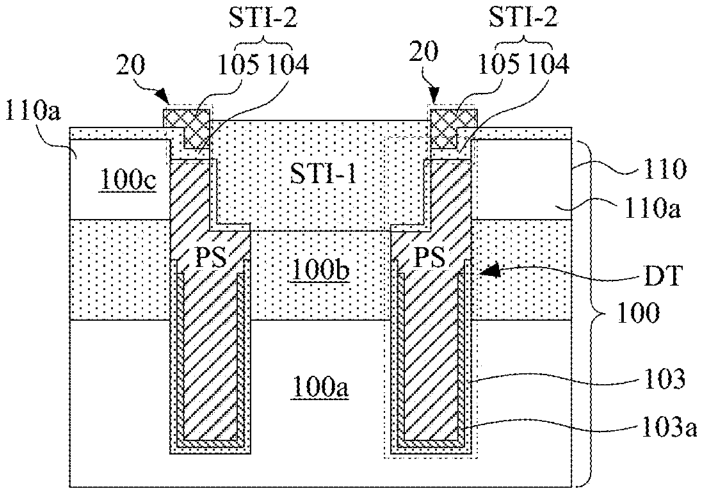
FIGS. 19 and 20 are schematic cross-sectional views of structures resulting from steps in the method according to the second embodiment of the present invention.

Starting with the structure shown in FIG. 12, in particular, referring to FIGS. 18A, 18B and 19, embodiment 2, step S6 may include: forming a second mask layer (e.g., a photoresist layer PR) over the first isolation dielectric STI-1 and the re-deposited nitride layer 105; and with the second mask layer serving as a mask, etching the re-deposited nitride layer 105. Referring to FIGS. 18A and 18B, the second mask layer covers the isolation recess 10 (and hence the first isolation dielectric STI-1) and the upper polysilicon recess 20, so as to remove at least a portion of the re-deposited nitride layer 105 above the surface of the first active sub-region 110*a*, and to keep a portion of the re-deposited nitride layer 105 within the upper polysilicon recess 20 for providing isolation between the polysilicon PS in the deep trench DT and the word line passing over the deep trench DT. The second mask layer also covers a portion of the re-deposited nitride layer 105 outside of the upper polysilicon recess 20. Afterwards, as shown in FIG. 19, after the re-deposited nitride layer 105 is etched with the second mask layer as a mask, the second mask layer is removed. As a result, the remaining portion of the re-deposited nitride layer 105 fills up the upper polysilicon recess 20 and covers a portion of a top surface of the first active sub-region 110*a*. The remaining re-deposited nitride layer 105 and the re-deposited oxide layer 104 in the upper polysilicon recess 20 forms the second isolation dielectric STI-2 that isolates the polysilicon PS in the deep trench DT from the word line.

Optionally, after the second isolation dielectric STI-2 is formed, the re-deposited nitride layer 105 may be further etched (e.g., using a wet etching process) to modify a height of the top surface of the second isolation dielectric STI-2 above the first active sub-region 110*a* and reduce the height difference between the top surfaces of the first isolation dielectric STI-1 and the second isolation dielectric STI-2. Preferably, the top surfaces of the first isolation dielectric STI-1 and the second isolation dielectric STI-2 are flush with each other.

Figure 20:
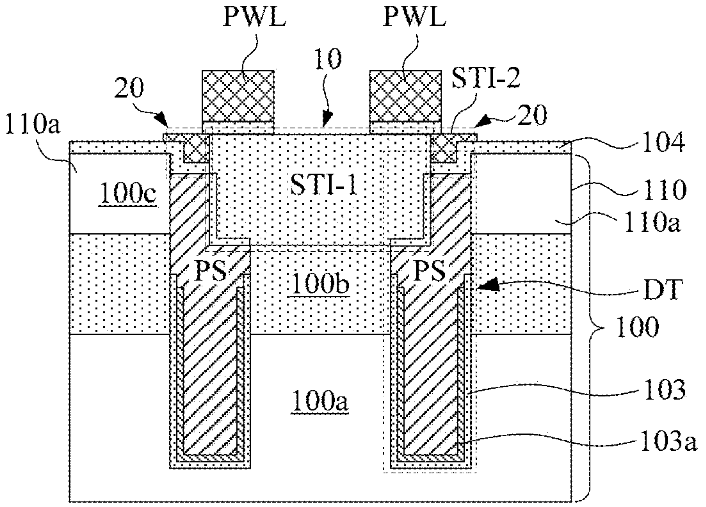

FIG. 20 shows a cross-sectional view of a structure resulting from the formation of word lines WL over the substrate 100 according to embodiment 2. Referring to FIG. 20, in step S7, at least one word line WL crossing over the first isolation dielectric STI-1 and/or the second isolation dielectric STI-2 is formed above the substrate 100. For more details of step S7 and the word line WL, reference can be made to the above related description in connection with the first embodiment.

In the methods of the foregoing embodiments, the pad oxide layer 101 and the pad nitride layer 102 are removed from the surface of the substrate 100 after the active area 110 and the deep trench DT filled with the polysilicon PS are formed, followed by the formation of the re-deposited oxide layer 104 and the re-deposited nitride layer 105. The re-deposited nitride layer 105 has greater uniformity than the pad nitride layer 102 that has undergone the formation of the deep trench. The isolation recess 10 is then formed at one side of the deep trench DT and then filled with the first isolation dielectric STI-1. In this process, the re-deposited nitride layer 105 can be utilized to control top surface flatness of the first isolation dielectric STI-1. After that, the upper polysilicon recess 20 between the first active sub-region 110*a* and the first isolation dielectric STI-1 is filled with the second isolation dielectric STI-2. With the first isolation dielectric STI-1 and the second isolation dielectric STI-2 isolating the polysilicon PS in the deep trench DT from the word line WL, effective isolation between the polysilicon PS and the word line WL can be ensured, which allows the resulting eDRAM to have improved performance and yield.

Embodiment 3

A third embodiment relates to an eDRAM fabricated according to the method of either the first or second embodiment. Referring to FIGS. 17A, 17B and 20, the eDRAM includes:

a substrate 100, in which at least one first active sub-region 110*a* is formed;

at least one deep trench DT in the substrate 100, which is filled with polysilicon PS, wherein the polysilicon PS in an upper portion of the deep trench DT is joined to the first active sub-region 110*a* and has a top surface lower than a top surface of the first active sub-region 110*a;* a first isolation dielectric STI-1 formed in an isolation recess 10 located at one side of the deep trench DT and opposite to the first active sub-region 110*a*, wherein the top surface of the polysilicon PS in the upper portion of the deep trench DT is lower than a top surface of the first isolation dielectric STI-1;

a second isolation dielectric STI-2 formed in an upper polysilicon recess 20 delimited by the polysilicon PS in the deep trench DT, and the first active sub-region 110*a* and the first isolation dielectric STI-1 that are located at the opposite sides of the polysilicon PS; and at least one word line WL formed over the substrate 100, the word line WL crossing over the first isolation dielectric STI1 and/or the second isolation dielectric STI2. The word line WL may be a passing word line PWL crossing over the first isolation dielectric STI1 and/or the second isolation dielectric STI2.

In the eDRAM formed according to the method of either of the foregoing embodiments, the polysilicon PS in the deep trench DT is effectively isolated from the word line WL crossing over the first isolation dielectric STI1 and/or the second isolation dielectric STI2. Therefore, it has improved performance and yield.

It is noted that the embodiments disclosed herein are described in a progressive manner, with the description of each embodiment focusing on its differences from others. Reference can be made between the embodiments for their identical or similar features.

The foregoing description is merely that of some preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method for making an embedded dynamic random-access memory (eDRAM), comprising:

forming a stack of a pad oxide layer and a pad nitride layer above a surface of a substrate;

forming, in the substrate, at least one active area and at least one deep trench filled with polysilicon, wherein each deep trench partitions the active area into a first active sub-region and a second active sub-region at opposite sides of the deep trench, wherein the polysilicon in an upper portion of the deep trench is joined to the first active sub-region and the second active sub-region, and wherein the polysilicon has a top surface lower than a top surface of the active area;

removing the pad nitride layer and the pad oxide layer;

forming a stack of a re-deposited oxide layer and a re-deposited nitride layer above the substrate;

etching the second active sub-region and the polysilicon joined to the second active sub-region, thereby forming an isolation recess at a first side of the deep trench opposite to the first active sub-region;

filling the isolation recess with a first isolation dielectric, wherein a remaining portion of the polysilicon in the upper portion of the deep trench is situated between the first active sub-region and the first isolation dielectric, and wherein the first active sub-region, the polysilicon and the first isolation dielectric delimit an upper polysilicon recess;

removing at least a portion of the re-deposited nitride layer located above a top surface of the first active sub-region and forming a second isolation dielectric in the upper polysilicon recess, wherein the second isolation dielectric has a top surface higher than the top surface of the first active sub-region; and forming at least one word line above the substrate, wherein the word line crosses over the first isolation dielectric and/or the second isolation dielectric.

2. The method of claim 1, wherein the substrate is a silicon-on-insulator (SOI) substrate, wherein the SOI comprises a doped substrate layer, a buried oxide layer located over the doped substrate layer and a device layer located over the buried oxide layer, and wherein the buried oxide layer is exposed at a bottom surface of the isolation recess.

3. The method of claim 1, wherein adjacent deep trenches partition a single active area and share the second active sub-region, and wherein an isolation recess is formed between the adjacent deep trenches.

4. The method of claim 1, wherein etching the second active sub-region and the polysilicon joined to the second active sub-region comprises:

forming a first mask layer on a surface of the re-deposited nitride layer, wherein the first mask layer comprises a pattern defining the isolation recess;

with the first mask layer serving as a mask, etching the second active sub-region at the first side of the deep trench and the polysilicon that is in the deep trench and is joined to the second active sub-region, thereby forming the isolation recess, wherein a surface of the polysilicon exposed in the isolation recess comprises an L shape; and removing the first mask layer.

5. The method of claim 1, further comprising, after forming the re-deposited nitride layer above the substrate, performing a chemical mechanical polishing (CMP) process on a top surface of the re-deposited nitride layer.

6. The method of claim 1, wherein filling the isolation recess with the first isolation dielectric comprises:

forming a liner oxide layer over a surface of the polysilicon exposed in the isolation recess;

depositing a first dielectric material into the isolation recess and on the re-deposited nitride layer; and performing a CMP process to remove the first dielectric material on the re-deposited nitride layer so that a top surface of the first dielectric material in the isolation recess is flush with a top surface of the re-deposited nitride layer, wherein the liner oxide layer and a remaining portion of the first dielectric material form the first isolation dielectric.

7. The method of claim 6, further comprising, after the top surface of the re-deposited nitride layer is exposed as a result of the CMP process, etching the first isolation dielectric to lower a top surface thereof to a predetermined height above the first active sub-region.

8. The method of claim 1, wherein removing at least the portion of the re-deposited nitride layer located above the top surface of the first active sub-region and forming the second isolation dielectric in the upper polysilicon recess comprises:

removing the re-deposited nitride layer, thereby exposing the re-deposited oxide layer that covers a surface of the first active sub-region and an inner wall of the upper polysilicon recess;

forming a liner nitride layer over surfaces of the re-deposited oxide layer and the first isolation dielectric;

depositing a second dielectric material over the liner nitride layer;

performing a CMP process to flatten a top surface of the second dielectric material;

etching the second dielectric material to expose the liner nitride layer; and removing the liner nitride layer outside of the upper polysilicon recess, wherein the re-deposited oxide layer is filled in the upper polysilicon recess, and wherein a remaining portion of the liner nitride layer and a remaining portion of the second dielectric material form the second isolation dielectric.

9. The method of claim 1, wherein removing at least the portion of the re-deposited nitride layer located above the top surface of the first active sub-region and forming the second isolation dielectric in the upper polysilicon recess comprises:

forming a second mask layer on the first isolation dielectric and the re-deposited nitride layer, wherein the second mask layer covers the isolation recess and the upper polysilicon recess;

removing the re-deposited nitride layer outside of the second mask layer; and removing the second mask layer, wherein a remaining portion of the re-deposited nitride layer fills up the upper polysilicon recess and covers a portion of the top surface of the first active sub-region, and wherein the remaining portion of the re-deposited nitride layer and the re-deposited oxide layer filled in the upper polysilicon recess form the second isolation dielectric.

10. The method of claim 9, further comprising, after removing the second mask layer, etching the second isolation dielectric to lower a top surface thereof to a predetermined height above the first active sub-region.

11. An embedded dynamic random-access memory (eDRAM) fabricated according to the method of claim 1, wherein the eDRAM comprises:

a substrate, wherein at least one first active sub-region is formed in the substrate;

at least one deep trench formed in the substrate, wherein the deep trench is filled with polysilicon, wherein the polysilicon in an upper portion of the deep trench is joined to the first active sub-region and has a top surface lower than a top surface of the first active sub-region;

a first isolation dielectric formed in an isolation recess, wherein the isolation recess is located at a first side of the deep trench and is opposite to the first active sub-region, and wherein the top surface of the polysilicon in the upper portion of the deep trench is lower than a top surface of the first isolation dielectric;

a second isolation dielectric formed in an upper polysilicon recess, wherein the upper polysilicon recess is delimited by the polysilicon, the first active sub-region and the first isolation dielectric that are located at the opposite sides of the polysilicon; and at least one word line formed above the substrate, wherein the word line crosses over the first isolation dielectric and/or the second isolation dielectric.

12. The eDRAM of claim 11, wherein the substrate is a silicon-on-insulator (SOI) substrate, wherein the SOI comprises a doped substrate layer, a buried oxide layer located over the doped substrate layer and a device layer located over the buried oxide layer, and wherein the buried oxide layer is exposed at a bottom surface of the isolation recess.

* * * * *